US010069003B2

(12) United States Patent
Ueno

(10) Patent No.: US 10,069,003 B2
(45) Date of Patent: Sep. 4, 2018

(54) MOSFET

(71) Applicant: FUJI ELECTRIC CO., LTD., Kanagawa (JP)

(72) Inventor: Katsunori Ueno, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/364,260

(22) Filed: Nov. 30, 2016

(65) Prior Publication Data

US 2017/0194478 A1 Jul. 6, 2017

(30) Foreign Application Priority Data

Jan. 5, 2016 (JP) .................................. 2016-000568

(51) Int. Cl.
*H01L 29/49* (2006.01)
*H01L 29/78* (2006.01)
(Continued)

(52) U.S. Cl.
CPC .......... *H01L 29/78* (2013.01); *H01L 21/0254* (2013.01); *H01L 21/02636* (2013.01);
(Continued)

(58) Field of Classification Search
CPC ................. H01L 29/78; H01L 21/0254; H01L 21/02636
See application file for complete search history.

(56) References Cited

U.S. PATENT DOCUMENTS

| 2004/0124435 A1* | 7/2004 | D'Evelyn | ............... | C30B 25/02 |
| | | | | 257/103 |
| 2011/0056429 A1* | 3/2011 | Raring | .................... | C30B 25/02 |
| | | | | 117/101 |

(Continued)

FOREIGN PATENT DOCUMENTS

JP 2008-243927 A 10/2008

OTHER PUBLICATIONS

Yuki Niiyama, "Normally off operation GaN-based MOSFETs for power electronics applications," Semiconductor Science and Technology 25 (2010) 125006 (pp. 1-14).
(Continued)

*Primary Examiner* — Michael Shingleton

(57) ABSTRACT

When a channel formation region is formed of GaN in a MOSFET, there are cases where the actual threshold voltage ($V_{th}$) is lower than the setting value thereof and the actual carrier mobility ($\mu$) during the ON state is lower than the setting value thereof. The reason for threshold voltage ($V_{th}$) and the carrier mobility ($\mu$) being lower than the setting values is unknown. A MOSFET including a gallium nitride substrate, an epitaxial layer made of gallium nitride provided on top of the gallium nitride substrate, a gate insulating film provided in direct contact with the epitaxial layer, and a gate electrode provided in contact with the gate insulating film. The gallium nitride substrate has a dislocation density less than or equal to 1E+6 $cm^{-2}$, and the epitaxial layer has a region with a p-type impurity concentration less than or equal to 5E+17 $cm^{-3}$.

7 Claims, 15 Drawing Sheets

(51) Int. Cl.
  *H01L 29/20* (2006.01)
  *H01L 29/10* (2006.01)
  *H01L 29/207* (2006.01)
  *H01L 29/51* (2006.01)
  *H01L 29/423* (2006.01)
  *H01L 29/66* (2006.01)
  *H01L 21/02* (2006.01)

(52) U.S. Cl.
  CPC ...... *H01L 29/1079* (2013.01); *H01L 29/2003* (2013.01); *H01L 29/207* (2013.01); *H01L 29/4236* (2013.01); *H01L 29/513* (2013.01); *H01L 29/517* (2013.01); *H01L 29/66522* (2013.01); *H01L 29/66666* (2013.01); *H01L 29/7827* (2013.01)

(56) References Cited

U.S. PATENT DOCUMENTS

| | | | | |
|---|---|---|---|---|
| 2011/0127581 | A1* | 6/2011 | Bethoux | H01L 21/187 257/201 |
| 2012/0037918 | A1* | 2/2012 | Miyazaki | H01L 24/05 257/76 |
| 2015/0054422 | A1* | 2/2015 | Koo | H05B 33/0872 315/250 |
| 2015/0069405 | A1* | 3/2015 | Yoshioka | H01L 29/66462 257/76 |
| 2015/0380498 | A1* | 12/2015 | Tanaka | H01L 29/7802 257/76 |
| 2016/0093492 | A1* | 3/2016 | Lee | H01L 21/02642 438/492 |
| 2017/0077830 | A1* | 3/2017 | Fujii | H01L 21/3245 |
| 2017/0170258 | A1* | 6/2017 | Takashima | H01L 29/045 |
| 2017/0194478 | A1* | 7/2017 | Ueno | H01L 29/78 |

OTHER PUBLICATIONS

Tohru Oka, "1. 8mΩ• cm2 vertical GaN-based trench metal-oxide-semiconductor field-effect-transistors on a free-standing GaN substrate for 1. 2-kV-class operation," Applied Physics Express 8 054101 (2015) (pp. 1-3).

* cited by examiner

MOSFET

The contents of the following Japanese patent application are incorporated herein by reference:
NO. 2016-000568 filed in JP on Jan. 5, 2016.

BACKGROUND

1. Technical Field

The present invention relates to a MOSFET.

2. Related Art

Conventionally, a transistor is formed by epitaxially growing gallium nitride (GaN) on top of a sapphire substrate, as shown in Patent Document 1 and Non-Patent Document 1.

Patent Document 1: Japanese Patent Application Publication No. 2008-243927

Patent Document 1: Semiconductor Science and Technology 25 (2010) 125006 (14 pp)

Non-Patent Document 2: 1.8 mΩ·cm2 vertical GaN-based trench metal-oxide-semiconductor field-effect-transistors on a free-standing GaN substrate for 1.2-kV-class operation, Applied Physics Express 8 054101 (2015)

When a channel formation region is formed of GaN in a MOSFET (Metal Oxide Semiconductor Field Effect Transistor), the actual threshold voltage ($V_{th}$) is lower than the setting value thereof. Furthermore, when the channel formation region is formed of GaN, there are cases where the actual carrier mobility (μ) during the ON state is lower than the setting value thereof. The reason for the actual threshold voltage ($V_{th}$) and the actual carrier mobility (μ) being lower than the setting values is unknown.

SUMMARY

According to a first aspect of the present invention, provided is A MOSFET comprising a gallium nitride substrate, an epitaxial layer, a gate insulating film, and a gate electrode. The epitaxial layer may be made of gallium nitride. The epitaxial layer may be provided on top of the gallium nitride substrate. The gate insulating film may be provided in direct contact with the epitaxial layer. The gate electrode may be provided in contact with the gate insulating film. The gallium nitride substrate may have a dislocation density less than or equal to 1E+6 $cm^{-2}$. The epitaxial layer has a region with a p-type impurity concentration less than or equal to 5E+17 $cm^{-3}$.

The region of the epitaxial layer may have the p-type impurity concentration less than or equal to 5E+16 $cm^{-3}$.

The p-type impurities include magnesium.

The gate insulating film may include silicon dioxide, aluminum oxide, or a layered film having silicon dioxide and aluminum oxide.

The region of the epitaxial layer may be a well region.

The MOSFET is a planar gate MOSFET in which the gate insulating may be provided on top of and in direct contact with the region of the epitaxial layer.

The epitaxial layer may include a trench portion. The gate insulating film and the gate electrode may be provided in the trench portion. The MOSFET may be a trench gate MOSFET in which the gate insulating film is provided in contact with side walls of the trench portion and in direct contact with the region of the epitaxial layer.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
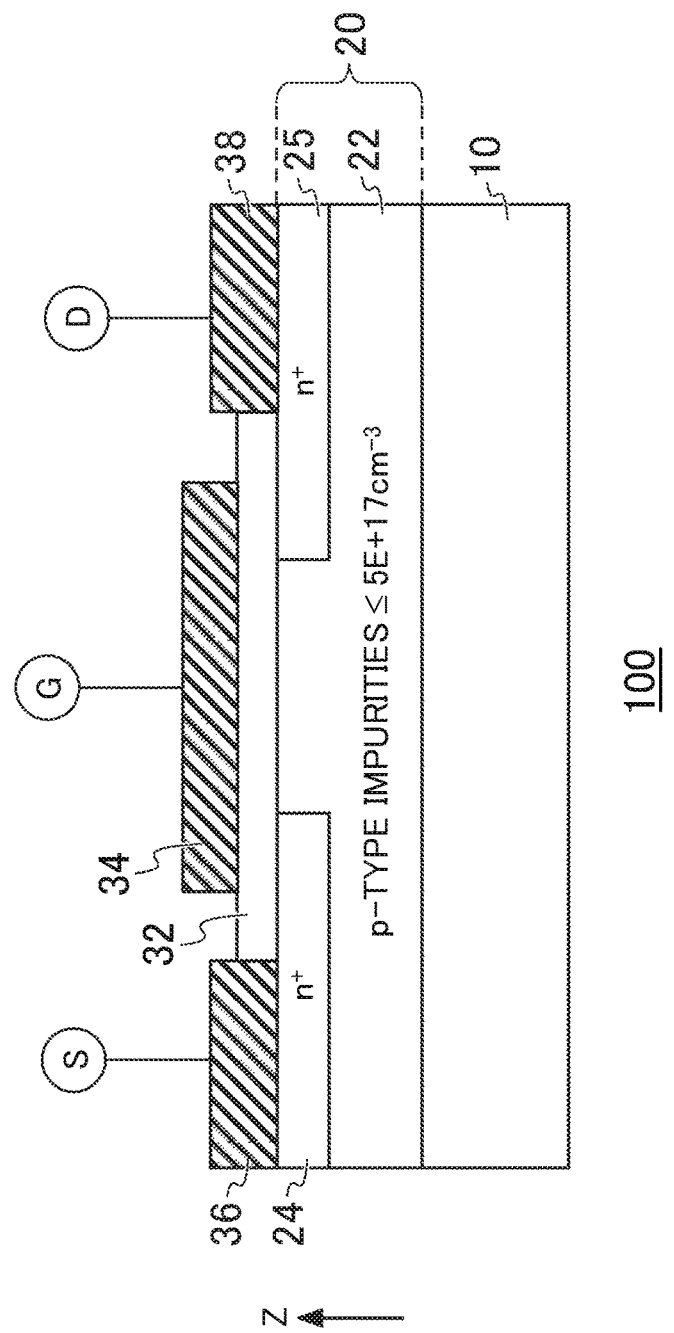
FIG. 1 is a schematic cross-sectional view of a MOSFET 100 according to a first embodiment.

FIG. 1 is a schematic cross-sectional view of a MOSFET 100 according to a first embodiment. The MOSFET 100 includes a substrate 10, an epitaxial layer 20, a gate insulating film 32, a gate electrode 34, a source electrode 36, and a drain electrode 38. The MOSFET 100 in this example is a planar gate MOSFET that has a flat gate electrode 34 and a gate insulating film 32 provided on top of and in contact with a p-type region 22 of the epitaxial layer 20. The gate insulating film 32 is provided on top of and in direct contact with the p-type region 22 of the epitaxial layer 20.

In this example, terms such as "above" and "top" refer to a direction from the substrate 10 toward the epitaxial layer 20, which is a direction perpendicular to the main surface of the substrate 10. The terms such as "above" and "top" refer to the +Z direction in FIG. 1. Furthermore, terms such as "below" and "bottom" refer to a direction opposite the direction referred to by the terms such as "above" and "top."

The substrate 10 in this example is a single-crystal substrate made of gallium nitride (referred to below as "GaN"). As another example, the substrate 10 may be a substrate having $n^-$-type impurities, i.e. an $n^-$-type GaN substrate. In this example, "n" and "p" respectively refer to a state in which electrons are the majority carrier and a state in which holes are the majority carrier. The "+" and "−" signs written to the upper right of "n" and "p" respectively mean that the carrier concentration is higher than in a case where a "+" sign is not written and that the carder concentration is lower than in a case where a "−" sign is not written.

The epitaxial layer 20 in this example is a GaN epitaxial layer provided on top of the substrate 10. The epitaxial layer 20 in this example is a p-type epitaxial layer. The epitaxial layer 20 in this example has a p-type impurity concentration less than or equal to 5E+17 [$cm^{-3}$]. Here, E indicates 10 raised to a certain power, e.g. 1E+16 indicates $1\times10^{16}$. The Z-direction plane orientation of the epitaxial layer 20 is preferably in a plane other than the c-plane, which is a polar plane. In this example, the Z-direction plane orientation of the epitaxial layer 20 may be in the m-plane or the a-plane.

The epitaxial layer 20 can be formed using metal organic chemical vapor deposition (MOCVD), halide vapor phase epitaxy (HYPE), or molecular beam epitaxy (MBE). The p-type impurities in the GaN may be one or more types of elements selected from among magnesium (Mg) and beryllium (Be). The n-type impurities in the GaN may be one or more types of elements selected from among oxygen (O) and silicon (Si).

In this example, metal organic chemical vapor deposition (MOCVD) is used. In this case, a gas formed by mixing together TMGa (Trimethylgalium) gas, ammonia ($NH_3$) gas, and CpMg (Cyclopentadienyl Magnesium) is introduced into the chamber. The epitaxial layer 20 may be formed in the chamber with a temperature from 800° C. to 1,200° C. and an atmospheric pressure less than or equal to 1013 hPa. As another example, Be may be used as the p-type impurities instead of Mg. In this case, instead of CpMg, one of DMBe (Ditnethylberyllium), DEBe (Diethylberylliutn), and (MeCP)$_2$Be (Bismethyl Cyclopentadienyl Beryllium) may be used.

The p-type impurities in the epitaxial layer 20 in this example are magnesium (Mg). The concentration of p-type impurities in the epitaxial layer 20 can be controlled according to the amount of CpMg introduced into the chamber. Compared to Be, there is an established method for controlling the doping concentration of Mg, and therefore it is possible to accurately control the concentration by using Mg as the p-type impurities.

In this example, by bubbling liquid CpMg with $N_2$ gas, gaseous CpMg is introduced into the chamber. At this time, the Mg concentration in the epitaxial layer 20 can be controlled according to the temperature of the liquid CpMg. Specifically, the Mg concentration in the epitaxial layer 20 can be decreased by decreasing the temperature of the liquid CpMg, and the Mg concentration in the epitaxial layer 20 can be increased by increasing the temperature of the liquid CpMg. Furthermore, it is possible to control the Mg concentration by controlling the flow rate of the $N_2$ gas used for the bubbling. In this example, the temperature of the liquid CpMg is controlled within a range of greater than or equal to −20° C. and less than or equal to −10° C. In this way, the p-type impurity concentration in the epitaxial layer 20 is controlled to be less than or equal to 5E+17 [$cm^{-3}$].

The epitaxial layer 20 includes an $n^+$-type source region 24 and an $n^+$-type drain region 25. The source region 24 and the drain region 25 are exposed in a portion of the topmost surface of the epitaxial layer 20. The source region 24 and the drain region 25 are separated from each other. The n-type impurity concentrations of the source region 24 and the drain region 25 may each be greater than or equal to 1E+19 [$cm^{-3}$] and less than or equal to 5E+20 [$cm^{-3}$]. The source region 24 and the drain region 25 may be formed by selectively regrowing $n^+$-type GaN after removing a portion of the epitaxial layer 20 through etching. Instead, the source region 24 and the drain region 25 may be formed by ion-injecting the n-type impurities in a portion of the epitaxial layer 20.

The source electrode 36 and the drain electrode 38 are respectively provided on top and in direct contact with the source region 24 and the drain region 25. The source electrode 36 and the drain electrode 38 may be layered metal films including a titanium (Ti) film and an aluminum (Al) film. In this example, a Ti film is provided on top of and in direct contact with the source region 24 and the drain region 25, which are semiconductor regions. Furthermore, an Al layer is provided on top of the Ti film. The source electrode 36 and the drain electrode 38 are respectively electrically connected to a source terminal and a drain terminal of the MOSFET 100.

The p-type epitaxial layer 20 includes a p-type region 22. The p-type region 22 has a p-type impurity concentration less than or equal to 5E+17 [$cm^{-3}$]. The epitaxial layer 20 includes the p-type region 22 between the source region 24 and the drain region 25. The p-type region 22 positioned between the source region 24 and the drain region 25 and directly below the gate electrode 34 functions as a channel formation region. The gate insulating film 32 need not be provided in direct contact with the entire top of the p-type region 22. The gate insulating film 32 may be provided in direct contact with at least a portion of the p-type region 22 that is to become the channel formation region.

The gate insulating film 32 may include one of silicon dioxide ($SiO_2$) and aluminum oxide ($Al_2O_3$). Instead, the gate insulating film 32 may be formed as a layered film including silicon dioxide and aluminum oxide layers. The layered film serving as the gate insulating film 32 may include a double layer in which aluminum oxide is provided on top of silicon dioxide or a double layer in which silicon dioxide is provided on top of aluminum oxide. The layered film serving as the gate insulating film 32 may have a triple layer in which aluminum oxide is provided on top of silicon dioxide and then silicon dioxide is further provided on top of this aluminum oxide. The layered film serving as the gate insulating film 32 may have a triple layer in which silicon dioxide is provided on top of aluminum oxide and then aluminum oxide is further provided on top of this silicon dioxide. The silicon dioxide and the aluminum oxide have a larger band gap than silicon nitride ($Si_3N_4$), and therefore are more suitable than silicon nitride for use in a gate insulating film. The gate insulating film 32 may be formed by a deposition technique such as plasma CVD or ALD.

The gate electrode 34 is provided on top of and in direct contact with the gate insulating film 32. The gate electrode 34 may be polysilicon. The gate electrode 34 is electrically connected to a gate terminal of the MOSFET 100. When a prescribed positive bias is applied to the gate electrode 34, a charge inversion layer is formed in the channel formation region of the p-type region 22. At this time, when a prescribed potential difference is formed between the source electrode 36 and the drain electrode 38, current flows in a current path through the source electrode 36, the source region 24, the channel formation region, the drain region 25, and the drain electrode 38. On the other hand, when a zero bias or a prescribed negative bias is applied to the gate electrode 34, the charge inversion layer of the channel formation region is eliminated. As a result, the current between the source electrode 36 and the drain electrode 38 is cut off.

The substrate 10 in this example is a GaN single-crystal substrate having a dislocation density less than or equal to 1E+6 [cm$^{-2}$]. The epitaxial layer 20 is homoepitaxially formed on top of the substrate 10. Therefore, the epitaxial layer 20 has a dislocation density approximately equal to the dislocation density of the substrate 10. Accordingly, the epitaxial layer 20 in this example has a dislocation density less than or equal to 1E+6 [cm$^{-2}$] and equivalent to that of the substrate 10. In this way, the dislocation density of the epitaxial layer 20 of this example can be made lower than in a case where the epitaxial layer 20 is heteroepitaxially formed directly on top of a sapphire substrate or where the epitaxial layer 20 is heteroepitaxially formed on top of a sapphire substrate with a buffer layer interposed therebetween.

If the dislocation density of the substrate 10 is greater than 1E+6 [cm$^{-2}$], the dislocation density of the epitaxial layer 20 also becomes higher. There is an idea that clumping of the p-type impurity atoms occurs at a location in the epitaxial layer 20 where dislocation occurs. A phenomenon whereby p-type impurity atoms clumped at the dislocation occurrence location cause the threshold voltage ($V_{th}$) and the carrier mobility to be lower than the setting values was found by the inventors of the present invention. Furthermore, it was found that, when a GaN substrate with a dislocation density less than or equal to 1E+6 [cm$^{-2}$] is used, the actual threshold value is approximately equal to the threshold value obtained theoretically. Yet further, it is believed that clumping of the p-type impurity atoms occurs more easily when the p-type impurity concentration is higher.

Conventionally, in a GaN crystal with a high dislocation density provided on top of a sapphire substrate or a Si substrate, it is known that Mg atoms in the GaN crystal are thermally diffused through high-temperature thermal processing at 1,000° C. or more. In contrast to this, through the experimentation by the inventors, it was confirmed that the Mg atoms in an epitaxial layer on top of a GaN substrate with a low dislocation density (less than or equal to 1E+6 [cm$^{-2}$]) are not diffused when undergoing thermal processing at a temperature of 1,200° C. or more. The mechanism for the thermal diffusion of the Mg atoms is believed to be that the Mg atoms become clumped at a dislocation and then become diffused along the dislocation. Therefore, in this example, the p-type impurity concentration was set to be less than or equal to 5E+17 [cm$^{-3}$]. In order to control the threshold value, it is necessary to simultaneously realize a dislocation density of 1E+6 [cm$^{-2}$] and a p-type impurity concentration of 5E+17 [cm$^{-3}$]. This is also supported by examples in which the threshold value of a MOSFET decreases when the p-type concentration is high even though a GaN crystal substrate is used (see Non-Patent Document 2).

In this way, it is possible to prevent clumping of the p-type impurities in the epitaxial layer 20, and therefore the characteristics of the MOSFET can be controlled. Specifically, it is possible to control the threshold voltage ($V_{th}$) to be in a range of greater than or equal to 3 [V] and less than or equal to 18 [V] and to control the carrier mobility ($\mu$) to be in a range of greater than or equal to 10 [cm$^2$/Vs] and less than or equal to 2,000 [cm$^2$/Vs]. In this way, it is possible to prevent the threshold voltage ($V_{th}$) and the carrier mobility ($\mu$) from being lower than the setting values.

Figure 2:
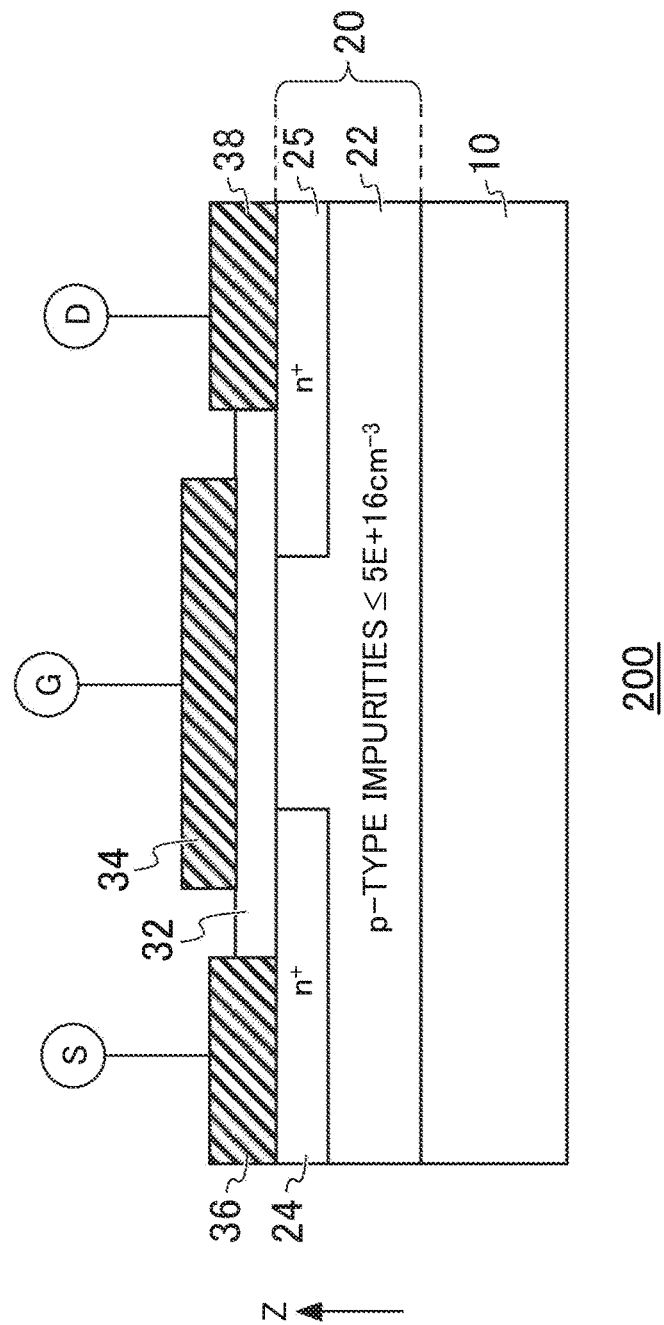
FIG. 2 is a schematic cross-sectional view of a MOSFET 200 according to a second embodiment.

FIG. 2 is a schematic cross-sectional view of a MOSFET 200 according to a second embodiment. In this example, the p-type region 22 of the epitaxial layer 20, in particular, has a p-type impurity concentration less than or equal to 5E+16 [cm$^{-3}$]. The p-type region 22 may have a p-type impurity concentration less than or equal to 1E+16 [cm$^{-3}$], which is the detection limit of SIMS (Secondary Ion Mass Spectroscopy). For example, the p-type region 22 has a p-type impurity concentration of 5E+15 [cm$^{-3}$]. The second embodiment differs from the first embodiment with regard to this point. When the p-type impurity concentration of the p-type region 22 serving as the channel formation region is lower, the threshold voltage ($V_{th}$) can be made lower and the carrier mobility ($\mu$) can be made higher.

Figure 3:
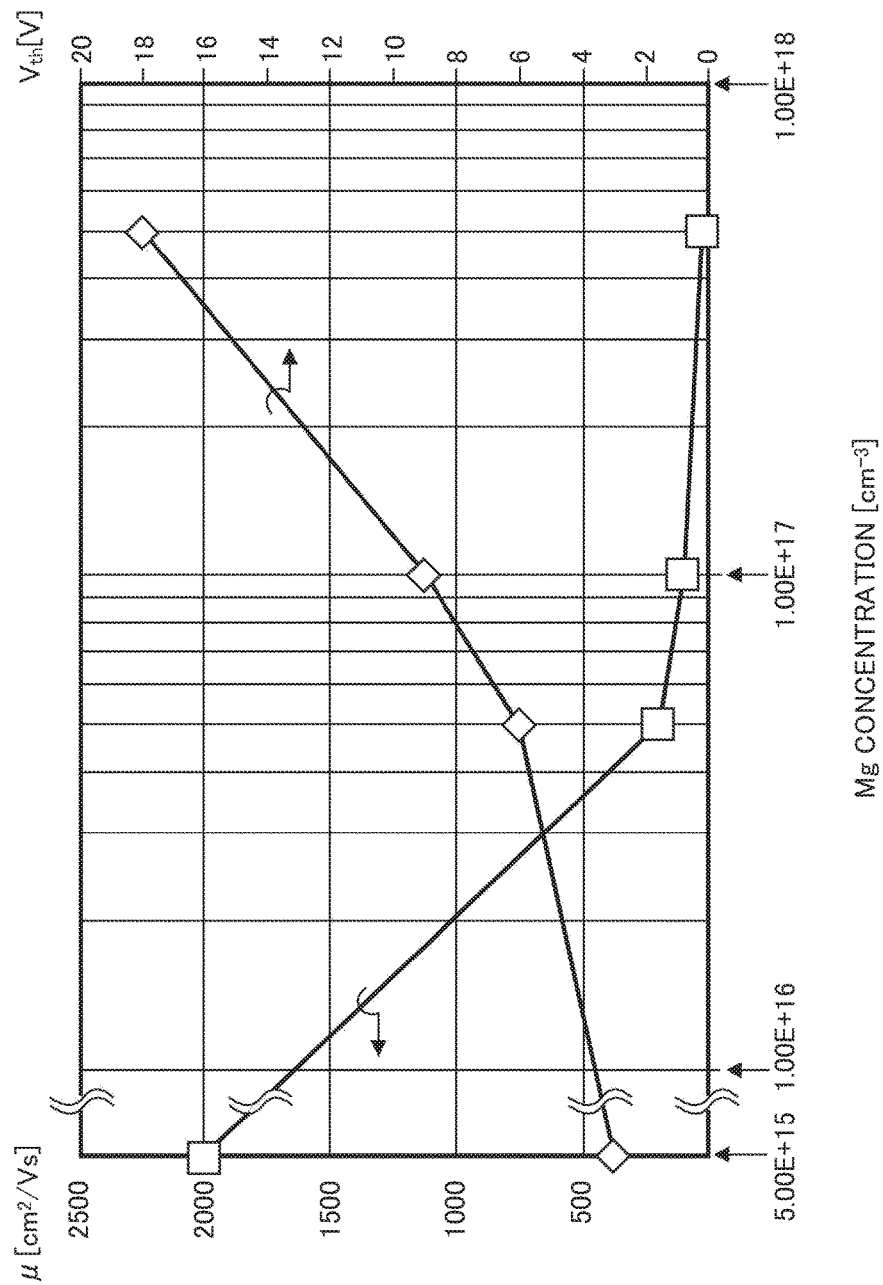
FIG. 3 shows the mobility μ and the threshold voltage $V_{th}$ relative to the Mg concentration.

FIG. 3 shows the mobility p, and the threshold voltage $V_{th}$ relative to the Mg concentration. The horizontal axis indicates the concentration of Mg in the epitaxial layer 20. The vertical axis on the left side indicates the carrier mobility $\mu$, and the vertical axis on the right side indicates the threshold voltage Vth, in this example, four MOSFETs were prepared that each have an epitaxial layer 20 with a different Mg concentration on top of a substrate 10 having a dislocation density less than or equal to 1E+6 [cm$^{-2}$]. The conditions other than the Mg concentration of the epitaxial layer 20, i.e. the structure, impurity concentration, and the like was the same in each of the four MOSFETs. Silicon dioxide (SiO$_2$) was used as the material of the gate insulating film 32. The mobility $\mu$ and the threshold voltage $V_{th}$ was measured for each of the four MOSFETs.

The threshold voltage $V_{th}$ may be controlled according to the thickness of the gate insulating film 32. The threshold voltage $V_{th}$ is higher when the gate insulating film 32 is thicker, and the threshold voltage $V_{th}$, is lower when the gate insulating film 32 is thinner. In this example, the thickness of the gate insulating film 32 was set to 100 [nm] in each of the four MOSFETs.

The Mg concentration can be measured by performing a SIMS analysis of the epitaxial layer 20. In a current SIMS analysis, the detection limit for Mg is 1E+16 [cm$^{-3}$]. In this example, one of the four MOSFETs has an Mg concentration in the epitaxial layer 20 that is lower than 1E+16 [cm$^{-3}$]. For example, an Mg concentration lower than this Mg concentration of 1E+16 [cm$^{-3}$] is 5E+15 [cm$^{-3}$]. This Mg concentration of 5E+15 [cm$^{-3}$] was confirmed by being less than or equal to the detection limit of the SIMS analysis. In addition, the acceptor concentration was confirmed according to the temperature dependency of a Hall measurement, which is an electrical measurement. In this way, it was confirmed that the Mg concentration was 5E+15 [cm$^{-3}$].

With the Mg concentration of 5E+15 [cm$^{-3}$], the mobility p, was 2,000 [cm$^2$/Vs] and the threshold voltage $V_{th}$, was 3 [V]. With an Mg concentration of 5E+16 [cm$^{-3}$], the mobility $\mu$, was 300 [cm$^2$/Vs] and the threshold voltage $V_{th}$ was 6 [V]. With an Mg concentration of 1E+17 [cm$^{-3}$], the mobility p, was 100 [cm$^2$/Vs] and the threshold voltage $V_{th}$ was 9 [V]. With an Mg concentration of 5E+17 [cm$^{-3}$], the mobility p, was 10 [cm$^2$/Vs] and the threshold voltage $V_{th}$ was 18 [V]. As described above, the measured threshold voltages $V_{th}$ approximately matched the theoretically calculated threshold voltage values.

The applicant for the present invention discovered that increasing the Mg concentration causes a decrease in the mobility $\mu$ and an increase in the threshold voltage $V_{th}$. In this way, it is possible to control the mobility $\mu$ and the threshold voltage Vth according to the Mg concentration. This result provides a guideline for controlling characteristics in a semiconductor device using GaN.

In consideration of the output voltage of the driver for turning the MOSFET ON and OFF, the threshold voltage $V_{th}$ is preferably around 5 [V]. Therefore, a favorable Mg concentration of the p-type region 22 is greater than or equal to 1E+16 [cm$^{-3}$] and less than or equal to 5E+16 [cm$^{-3}$].

Figure 4:
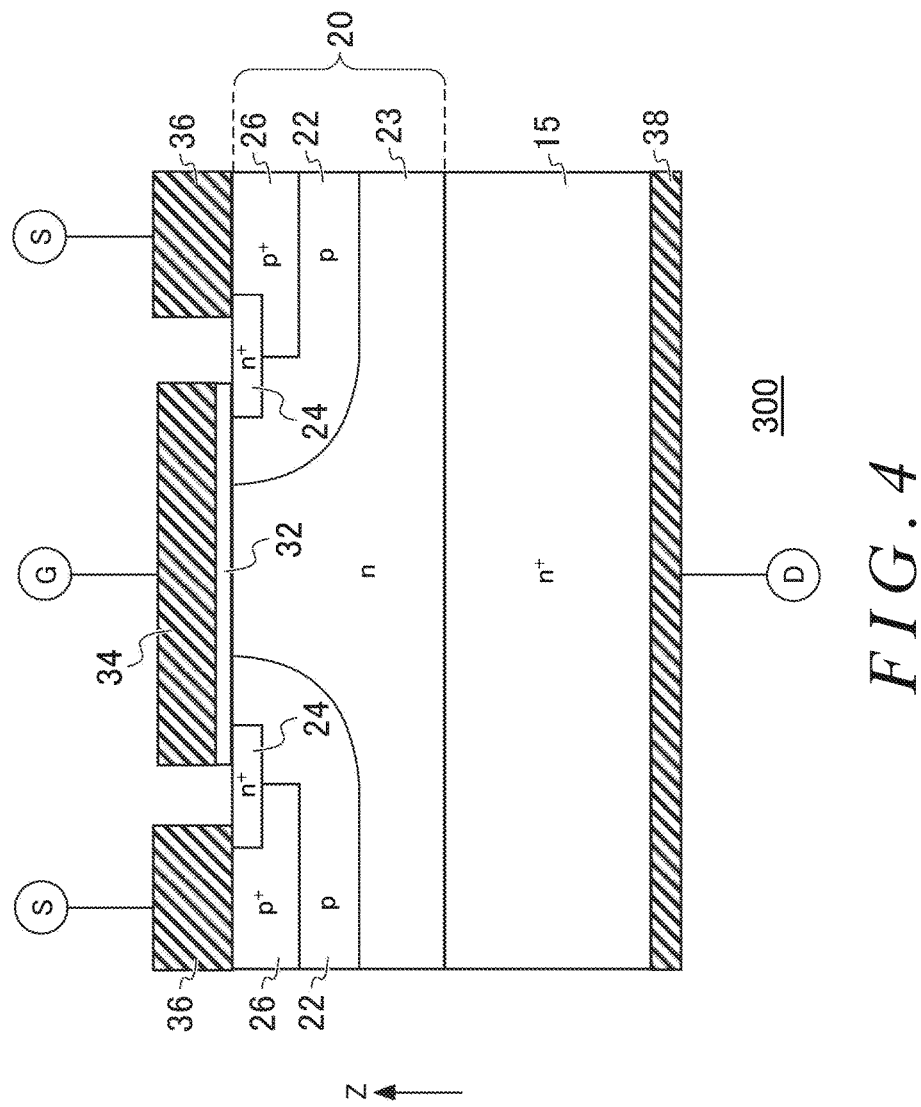
FIG. 4 is a schematic cross-sectional view of a MOSFET 300 according to a third embodiment.

FIG. 4 is a schematic cross-sectional view of a MOSFET 300 according to a third embodiment. The MOSFET 300 in this example is a so-called vertical MOSFET. The MOSFET 300 includes an n⁺-type substrate 15, an n-type drift region 23, and a p⁻-type contact region 26. Furthermore, the drain electrode 38 is provided in direct contact with the +Z-direction main surface of the substrate 15. In addition, the p-type region 22 of the epitaxial layer 20 is a well region. The third embodiment differs from the first embodiment with regard to these points. However, it should be noted that in this example as well, the n⁻-type GaN substrate 15 and the p-type region 22 have a dislocation density less than or equal to 1E+6 [cm⁻²] and the p-type region 22 has a p-type impurity concentration less than or equal to 5E+17 [cm⁻³].

The well-shaped p-type region 22 is provided with an n⁺-type source region 24 and a p⁺-type contact region 26. The source region 24 and the contact region 26 are provided above the bottom portion that is below the well-shaped p-type region 22. The impurity concentration of the p⁺-type contact region 26 may be greater than or equal to 1E+19 [cm⁻³] and less than or equal to 5E+20 [cm⁻³]. The source region 24 and the contact region 26 may be exposed to the outside in the topmost surface of the epitaxial layer 20. The source electrode 36 is provided at least on top of the contact region 26. The source electrode 36 and the drain electrode 38 may each be a metal layered film including a titanium film in contact with the GaN semiconductor region and an aluminum film provided in contact with this titanium film.

A pair of the p-type regions 22 is formed sandwiching a mesa portion of the drift region 23 directly below the gate electrode 34. In this example, "sandwiching" means that the ends of at least a portion of a configurational element are sandwiched in a direction of a plane perpendicular to the Z direction. In the p-type regions 22 sandwiching the mesa portion, the portions directly below the gate electrode 34 become the channel formation region. A pair of the source regions 24 and a pair of the contact regions 26 also sandwich the mesa portion directly below the gate electrode 34. It should be noted that the channel formation region of the p-type regions 22, the source region 24, and the contact region 26 are arranged outward in the stated order and centered on the mesa portion.

In this example as well, it is possible to prevent clumping of the p-type impurities in the epitaxial layer 20. Therefore, it is possible to control the characteristics of the MOSFET. Specifically, when the Mg concentration in the epitaxial layer 20 is set to be greater than or equal to 5E+15 [cm⁻³] and less than or equal to 5E+17 [cm⁻³], the threshold voltage ($V_{th}$) can be controlled to be in a range of greater than or equal to 3 [V] and less than or equal to 18 [V] and the carrier mobility can be controlled to be in a range of greater than or equal to 10 [cm²/Vs] and less than or equal to 2,000 [cm⁻²/Vs]. Therefore, the threshold voltage ($V_{th}$) and the carrier mobility ($\mu$) can be prevented from becoming lower than the setting values.

Furthermore, since the dislocation density of the p-type region 22 in this example is a low value less than or equal to 1E+6 [cm⁻²], the doped impurities are activated but not easily diffused by the application of the thermal processing. Therefore, compared to a case where the dislocation density of the p-type region 22 is higher than 1E+6 [cm⁻²], it is possible to provide the n⁺-type source region 24 and the p⁺-type contact region 26 close to each other. Accordingly, the device structure can be made more fine. The p-type region 22 may be formed by doping the epitaxial layer 20 with p-type impurities. In this case, the p-type region 22, the n⁺-type source region 24, and the p⁺-type contact region 26 can be provided close to each other, and therefore the device structure can be made even more fine.

Figure 5:
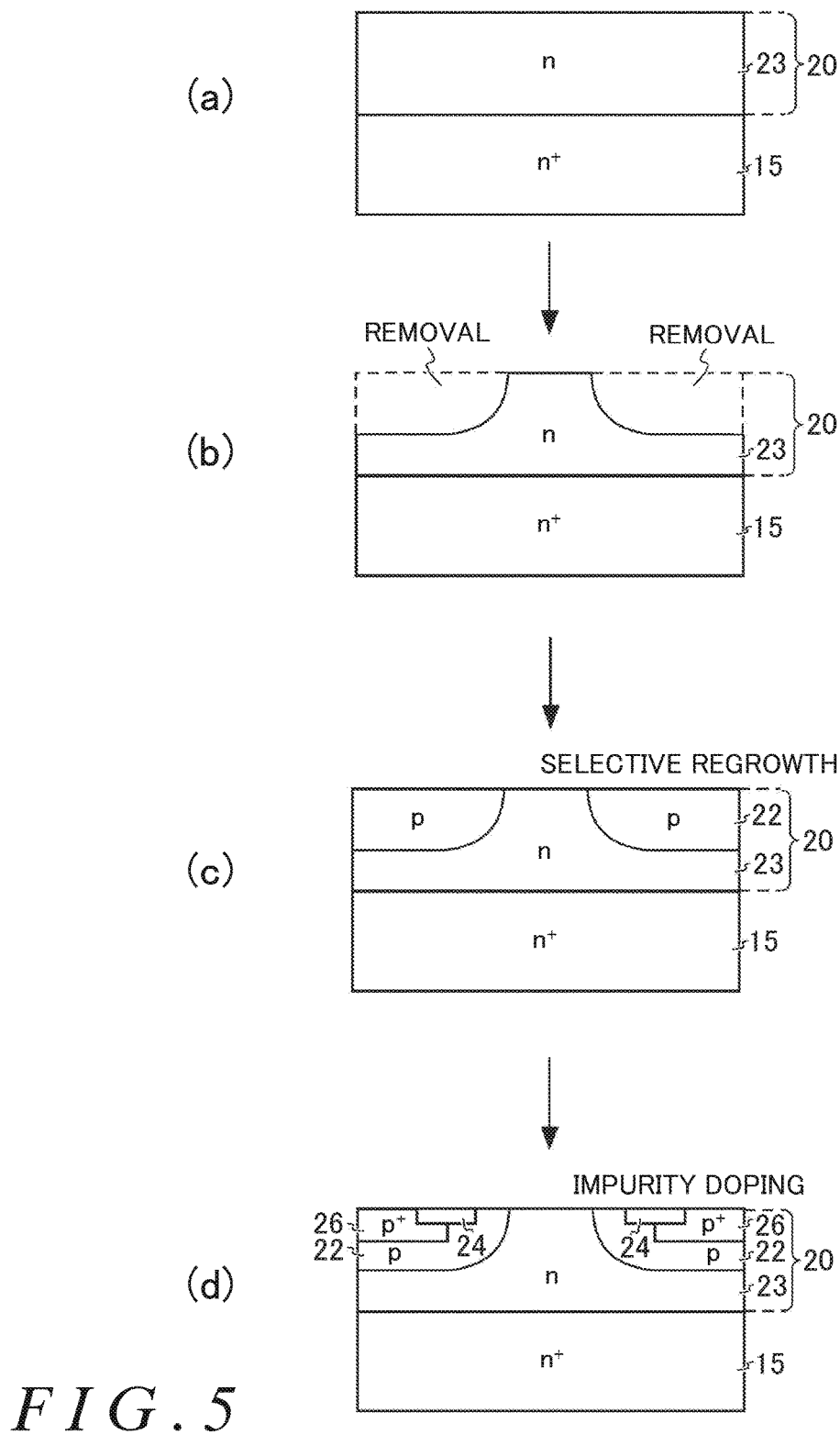
FIG. 5 shows a first manufacturing method for manufacturing the MOSFET 300.

FIG. 5 shows a first manufacturing method for manufacturing the MOSFET 300. In the first manufacturing method, the p-type region 22 is formed by selective regrowth. Here, "selective regrowth" means epitaxially forming a layer or region. Stage (a) in FIG. 5 shows a stage of epitaxially forming the n-type drift region 23 on top of the n⁺-type substrate 15. Stage (b) in FIG. 5 is the stage after stage (a) in FIG. 5. Stage (b) in FIG. 5 shows a stage of removing a portion of the n-type drift region 23. The removal of the portion of the drift region 23 may be realized using a known etching technique. For example, the portion of the drift region 23 is removed using RIE (Reactive Ion Etching).

Stage (c) in FIG. 5 is the stage after stage (b) in FIG. 5. Stage (c) in FIG. 5 shows a stage of selectively regrowing the p-type region 22 at a position where the portion of the drift region 23 was removed. For example, the p-type GaN epitaxial layer 20 is regrown after selectively providing a mask on a top portion of the mesa portion of the drift region 23. In this way, the p-type region 22 can be selectively regrown at a position where the portion of the drift region 23 was removed. If the p-type region 22 is being formed using ion injection, it is necessary to perform thermal processing at a temperature approximately from 1,200° C. to 1,400° C. after the ion injection. If selective regrowth is used, this type of high-temperature thermal processing is unnecessary. When a GaN epitaxial layer 20 undergoes thermal processing at a temperature approximately from 1,200° C. to 1,400° C., there are cases where nitrogen (N) is removed from the GaN crystal structure at the front surface. In this example, thermal processing at a temperature approximately from 1,200° C. to 1,400° C. is unnecessary when forming the p-type region 22, and therefore it is possible to prevent the removal of nitrogen from the front surface of the epitaxial layer 20.

Stage (d) in FIG. 5 is the stage after stage (c) in FIG. 5. Stage (d) in FIG. 5 shows a stage of ion-injecting the n-type and p-type impurities into the p-type region 22 and then applying thermal processing. In this way, the n⁺-type source region 24 and the p⁺-type contact region 26 are formed. After this, the gate insulating film 32, the gate electrode 34, the source electrode 36, and the drain electrode 38 are formed to complete the MOSFET 300.

Figure 6:
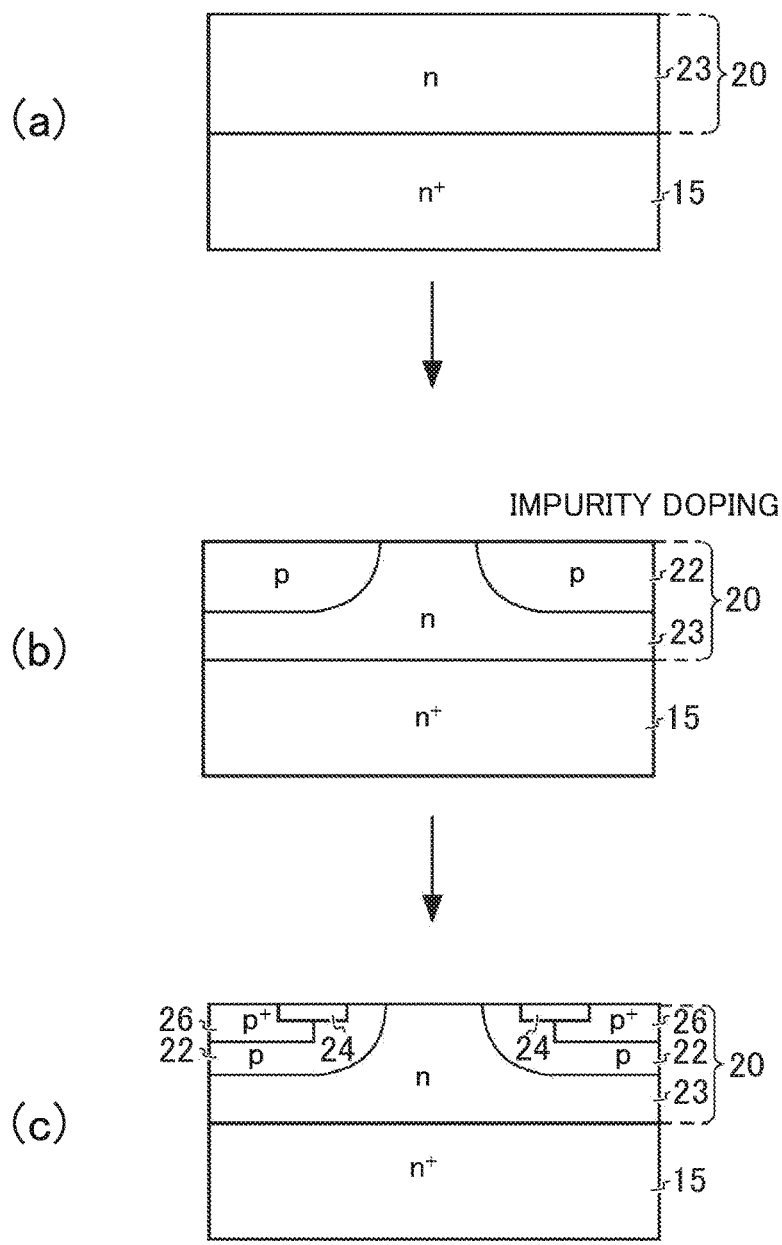
FIG. 6 shows a second manufacturing method for manufacturing the MOSFET 300.

FIG. 6 shows a second manufacturing method for manufacturing the MOSFET 300. In the second manufacturing method, the p-type region 22 is not formed using selective regrowth. In the second manufacturing method, the p-type region 22 is formed by ion-injecting p-type impurities into a portion of the n-type drift region 23. The second, manufacturing method differs from the first manufacturing method with regard to this point.

Stage (a) in FIG. 6 shows a stage of epitaxially forming the n-type drift region 23 on top of the n⁺-type substrate 15. Stage (b) in FIG. 6 is the stage after stage (a) in FIG. 6. Stage (b) in FIG. 6 shows a stage of ion-injecting p-type impurities into a portion of the n-type drift region 23 and then applying thermal processing. In this way, the p-type region 22 is formed. The thermal processing may be applied after a cap layer for blocking the removal of nitrogen is provided on top of the epitaxial layer 20 following the ion injection. Stage (c) in FIG. 6 is the stage after stage (b) in FIG. 6. Stage (c) in FIG. 6 shows a stage of ion-injecting n-type and p-type impurities into the p-type region 22 and then applying thermal processing. In this way, the n⁺-type source region 24 and the p⁺-type contact region 26 are formed. After this, the gate insulating film 32, the gate electrode 34, the source electrode 36, and the drain electrode 38 are formed to complete the MOSFET 300.

Figure 7:
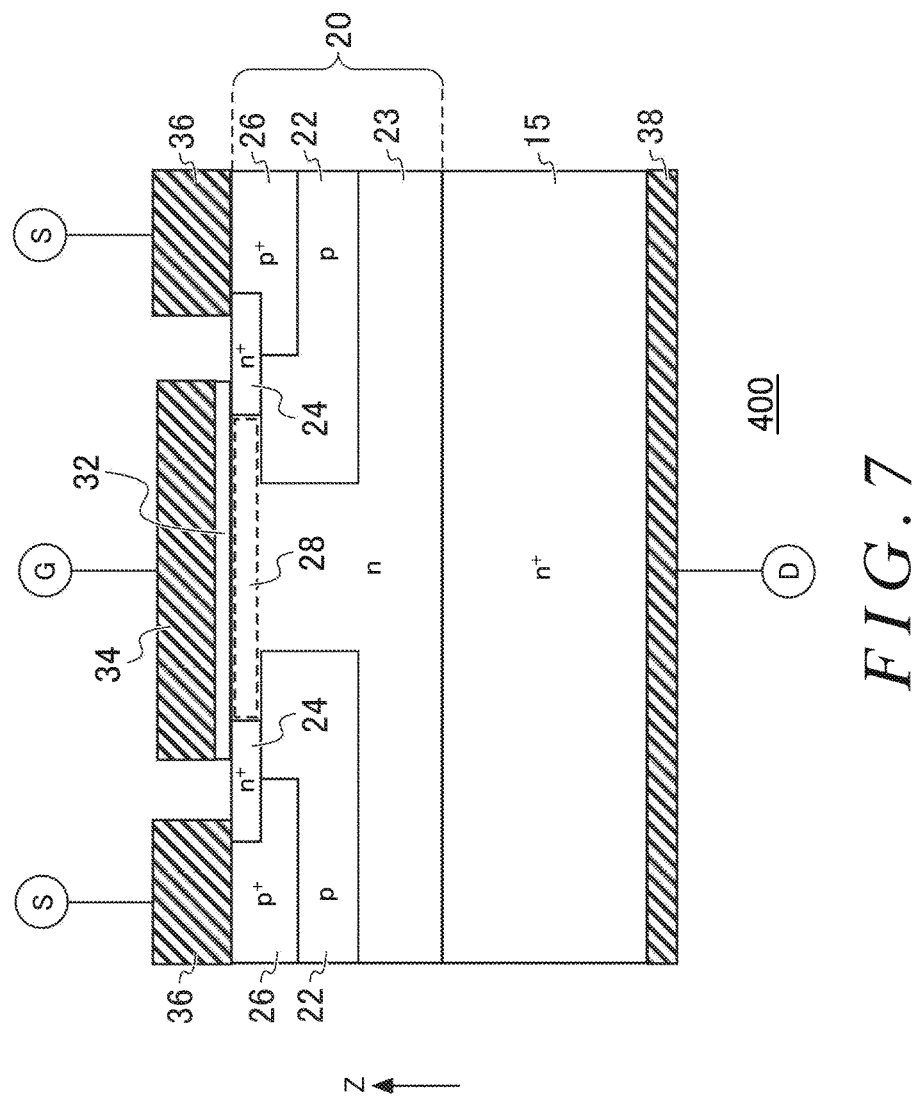
FIG. 7 is a schematic cross-sectional view of a MOSFET 400 according to a fourth embodiment.

FIG. 7 is a schematic cross-sectional view of a MOSFET 400 according to a fourth embodiment. In this example, a p-type region 28 having a dislocation density less than or equal to 1E+6 [cm$^{-2}$] and a p-type impurity concentration less than or equal to 5E+16 [cm$^{-3}$] is included in the topmost portion of the mesa portion of the n-type drift region 23. The fourth embodiment differs from the third embodiment with regard to this point. The p-type region 22 in this example has a dislocation density less than or equal to 1E+6 [cm$^{-2}$]. The p-type impurities of the p-type region 22 may be the same as those of the p-type region 28, and the p-type impurity concentration of the p-type region 22 may be higher than that of the p-type region 28 and less than or equal to 5E+17 [cm$^{-3}$].

The p-type region 28 in this example is positioned between a pair of the source regions 24, directly below the gate insulating film 32 and the gate electrode 34. The p-type region 28 functions as the channel formation region. The p-type region 28 may have a p-type impurity concentration less than or equal to 1E+16 [cm$^{-3}$], which is the detection limit of a SIMS analysis. For example, the p-type region 28 has a p-type impurity concentration of 5E+15 [cm$^{-3}$]. When the p-type impurity concentration of the p-type region 28 is lower, the threshold voltage ($V^{th}$) can be made lower and the carrier mobility ($\mu$) can be made higher.

Figure 8:
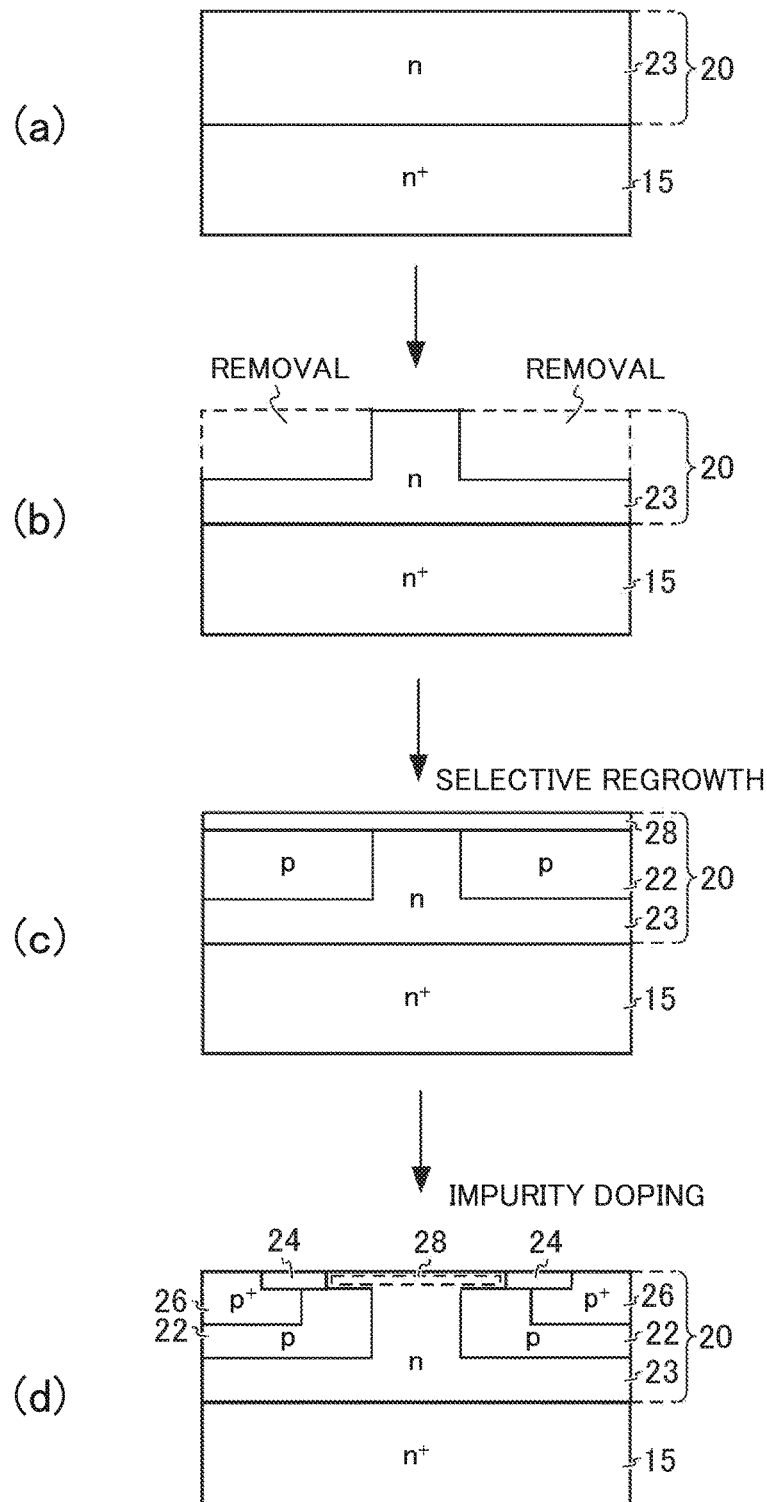
FIG. 8 shoals a first manufacturing method for manufacturing the MOSFET 400.

FIG. 8 shows a first manufacturing method for manufacturing the MOSFET 400. In this example, the p-type region 22, the n$^+$-type source region 24, the p$^+$-type contact region 26, and the p-type region 28 are formed using selective regrowth. Stage (a) in FIG. 8 shows a stage of epitaxially forming the n-type drift region 23 on top of the n$^-$-type substrate 15. Stage (b) in FIG. 8 is the stage after stage (a) in FIG. 8. Stage (b) in FIG. 8 shows a stage of removing a portion of the n-type drift region 23. The removal of the portion of the drift region 23 may be performed using a known etching method.

Stage (c) in FIG. 8 is the stage after stage (b) in FIG. 8. Stage (c) in FIG. 8 is a stage of selectively regrowing the p-type region 22 and then selectively regrowing the p-type region 28 at a position where the portion of the drift region 23 was removed. For example, the p-type GaN epitaxial layer is regrown after selectively providing a mask on the top surface of the drift region 23. In this way, the p-type region 22 is formed. After this, the p-type region 28 is selectively regrown.

Stage (d) in FIG. 8 is the stage after stage (c) in FIG. 8. Stage (d) in FIG. 8 shows a stage of ion-injecting n-type and p-type impurities into the p-type region 22 and the p-type region 28, and then applying thermal processing. In this way, the n$^+$-type source region 24 and the p$^+$-type contact region 26 are formed. After this, the gate insulating film 32, the gate electrode 34, the source electrode 36, and the drain electrode 38 are formed to complete the MOSFET 400.

Figure 9:
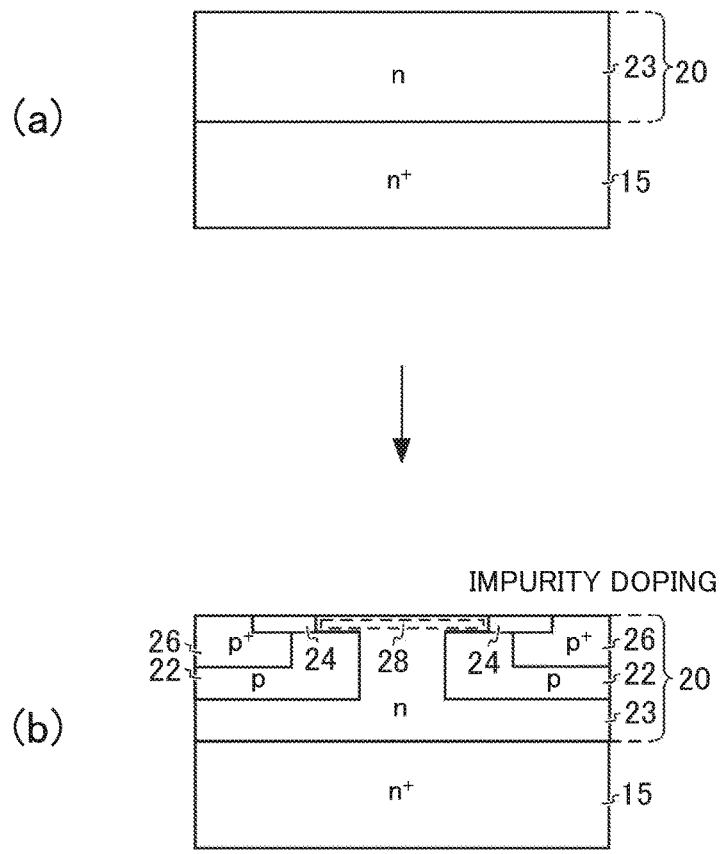
FIG. 9 shows a second manufacturing method for manufacturing the MOSFET 400.

FIG. 9 shows a second manufacturing method for manufacturing the MOSFET 400. Stage (a) in FIG. 9 shows a stage of epitaxially forming the n-type drift region 23 on top of the n'-type substrate 15. Stage (b) in FIG. 9 is the sage after stage (a) in FIG. 9. Stage (b) in FIG. 9 shows a stage of ion-injecting n-type and p-type impurities into the n-type drift region 23, and then applying thermal processing. In this way, the p-type region 22, the n$^+$-type source region 24, the p$^+$-type contact region 26, and the p-type region 28 are formed. After this, the gate insulating film 32, the gate electrode 34, the source electrode 36, and the drain electrode 38 are formed to complete the MOSFET 400.

Figure 10:
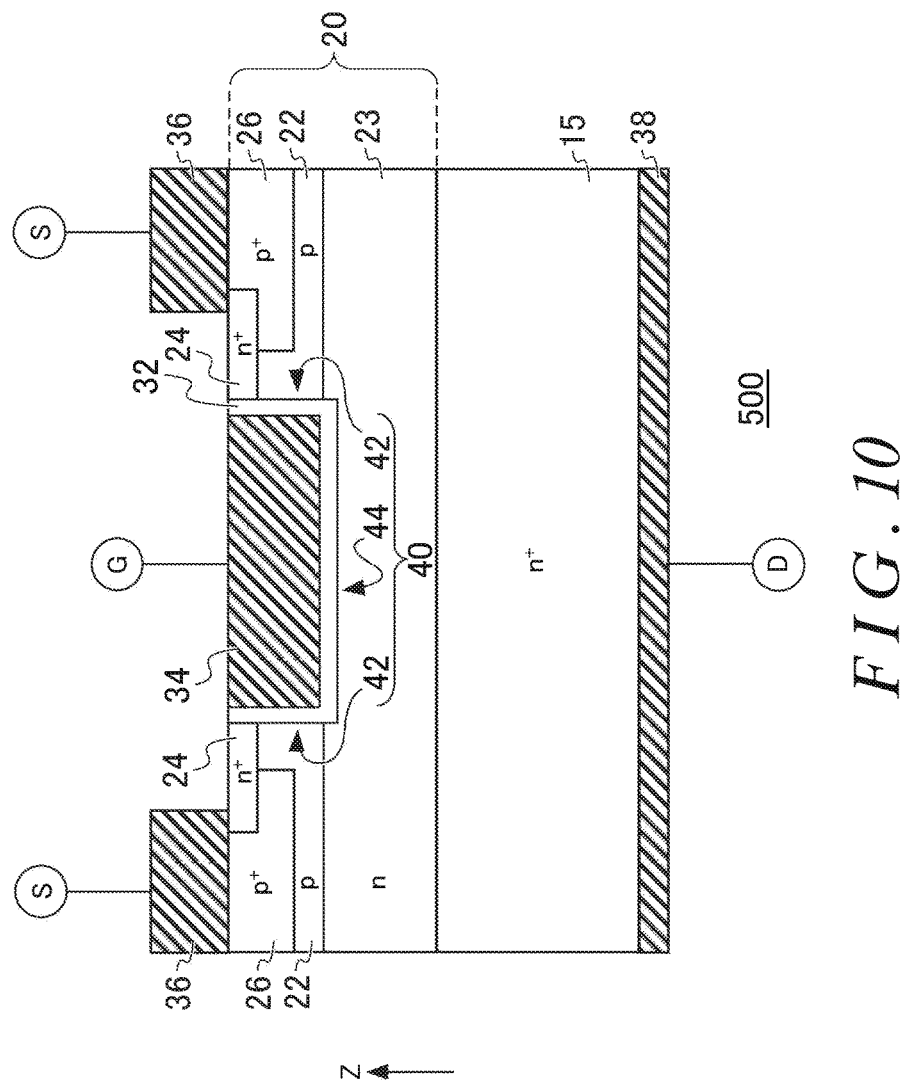
FIG. 10 is a schematic cross-sectional view of a MOSFET 500 according to a fifth embodiment.

FIG. 10 is a schematic cross-sectional view of a MOSFET 500 according to a fifth embodiment. The MOSFET 500 in this example is a trench gate MOSFET. The MOSFET 500 in this example includes a trench portion 40 in the epitaxial layer 20. Furthermore, the p-type region 22 of the epitaxial layer 20 is a well region provided in contact with side walls 42 of the trench portion 40. The fifth embodiment differs from the third embodiment with regard to these points. Regarding other points, the fifth embodiment is the same as the third embodiment.

The trench portion 40 includes the side walls 42 and a bottom portion 44. For example, the trench portion 40 is shaped as a trench having a long portion in a direction into the plane of the drawing. The bottom portion 44 is a bottom surface of the trench portion 40. The bottom portion 44 in this example may be a surface parallel to a plane perpendicular to the Z direction. In another example, the bottom portion 44 may be a curved surface with a convex shape protruding in the −Z direction.

The surfaces in the trench portion 40 that are not the bottom portion 44 are the side walls 42. In this example, the side walls 42 are surfaces parallel to the +Z direction. The gate insulating film 32 is provided in contact with the side walls 42 and the bottom portion 44 of the trench portion 40. The gate electrode 34 is provided in direct contact with the gate insulating film 32. The gate insulating film 32 provided in contact with the side walls 42 directly contacts the p-type region 22 of the epitaxial layer 20. The region of the p-type region 22 in contact with the gate insulating film 32 on the side walls 42 becomes the channel formation region when the prescribed voltage is applied to the gate electrode 34.

Figure 11:
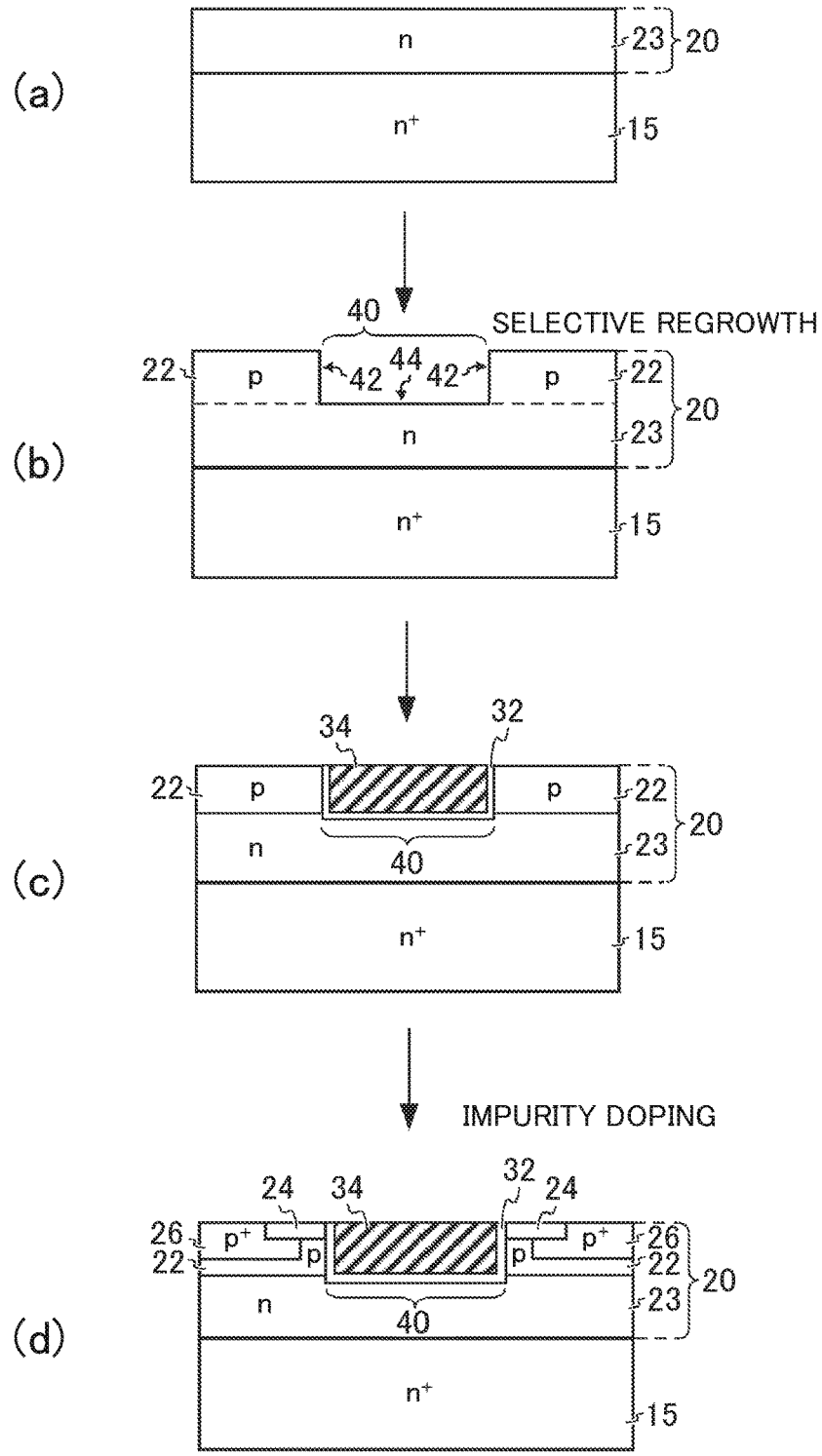
FIG. 11 shows a first manufacturing method for manufacturing the MOSFET 500.

FIG. 11 shows a first manufacturing method for manufacturing the MOSFET 500. In the first manufacturing method, the p-type region 22 is formed using selective regrowth. Stage (a) in FIG. 11 shows a stage of epitaxially forming the n-type drift region 23 on top of the n$^+$-type substrate 15. Stage (b) in FIG. 11 is the stage after stage (a) in FIG. 11. Stage (b) in FIG. 11 shows a stage of selectively regrowing the p-type region 22. The p-type region 22 is selectively regrown in a portion of the region on top of the drift region 23 that is outside the region where the trench portion 40 is formed.

Stage (c) in FIG. 11 is the stage after stage (b) in FIG. 11. Stage (c) in FIG. 11 shows a stage of forming the gate insulating film 32 and the gate electrode 34 in the trench portion 40. Stage (d) in FIG. 11 is the stage after stage (c) in FIG. 11. Stage (d) in FIG. 11 shows a stage of ion-injecting n-type and p-type impurities into the p-type region 22, and then applying thermal processing. In this way, the n$^+$-type source region 24 and the p$^-$-type contact region 26 are formed. After this, the gate insulating film 32, the gate electrode 34, the source electrode 36, and the drain electrode 38 are formed to complete the MOSFET 500.

Figure 12:
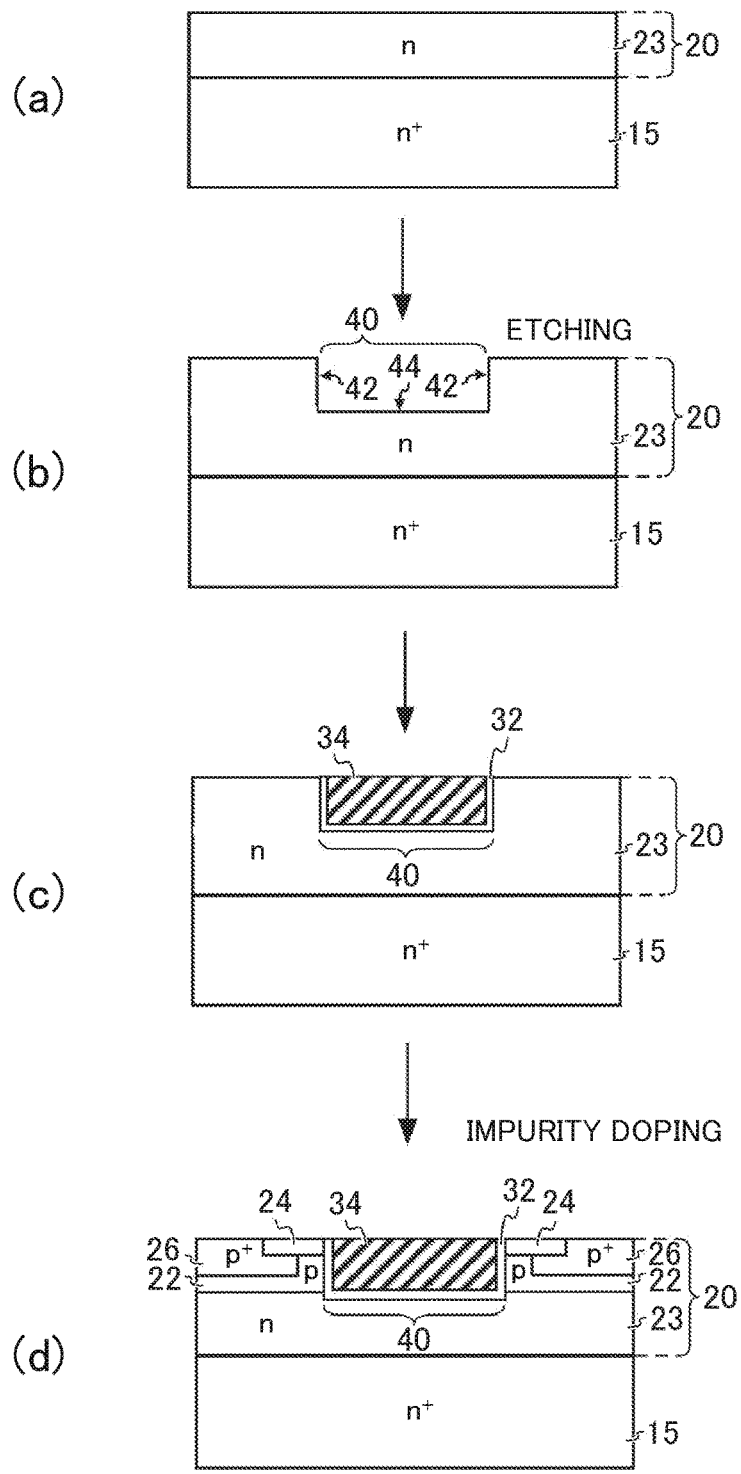
FIG. 12 shows a second manufacturing method for manufacturing the MOSFET 500.

FIG. 12 shows a second manufacturing method for manufacturing the MOSFET 500. In the second manufacturing method, the trench portion 40 is formed using etching. Furthermore, the p-type region 22 is formed by ion-injecting p-type impurities into a portion of the n-type drift region 23. The second manufacturing method differs from the first manufacturing method with regard to these points.

Stage (a) in FIG. 12 shows a stage of epitaxially forming the n-type drift region 23 on top of the n$^+$-type substrate 15. Stage (b) in FIG. 12 is the stage after stage (a) in FIG. 12. Stage (b) in FIG. 12 shows a stage of removing the drift region 23 at a position where the trench portion 40 is formed.

Stage (c) in FIG. 12 is the stage after stage (b) in FIG. 12. Stage (c) in FIG. 12 shows a stage of forming the gate insulating film 32 and the gate electrode 34 in the trench portion 40.

Stage (d) in FIG. 12 is the stage after stage (c) in FIG. 12. Stage (d) in FIG. 12 shows a stage of ion-injecting p-type impurities into a portion of the n-type drift region 23, and then applying thermal processing. In this way, the p-type region 22, the n$^+$-type source region 24, and the p$^+$-type contact region 26 are formed. After this, the gate insulating film 32, the gate electrode 34, the source electrode 36, and the drain electrode 38 are formed to complete the MOSFET 500.

Figure 13:
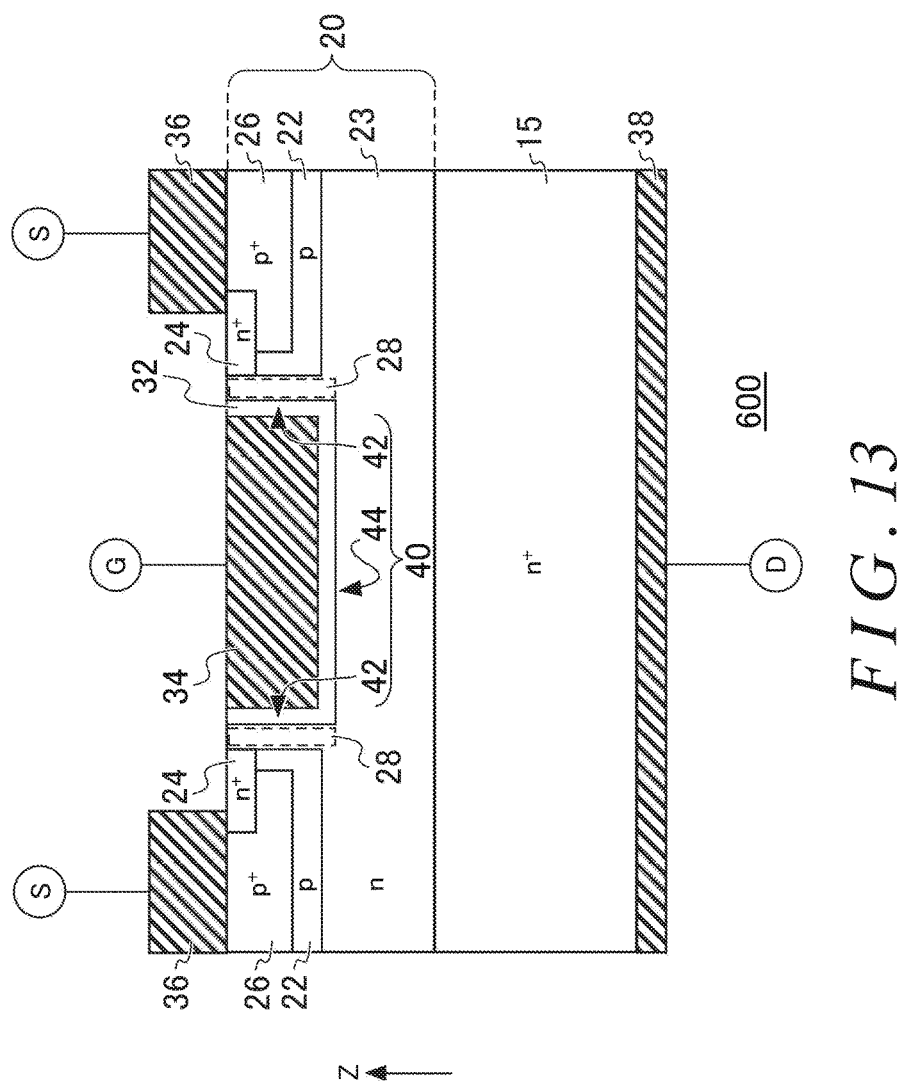
FIG. 13 is a schematic cross-sectional view of a MOSFET 600 according to a sixth embodiment.

FIG. 13 is a schematic cross-sectional view of a MOSFET 600 according to a sixth embodiment. In this example, the p-type region 28 having a dislocation density less than or equal to 1E+6 [cm$^{-2}$] and a p-type impurity concentration less than or equal to 5E+16 [cm$^{-3}$] is included between the p-type region 22 and the side walls 42 of the trench portion 40. The sixth embodiment differs from the fifth embodiment with regard to this point. The p-type region 22 in this example has a dislocation density less than or equal to 1E+6 [cm$^{-2}$]. The p-type impurity concentration of the p-type region 22 may be the same as the p-type impurity concentration of the p-type region 28, or may be higher than the p-type impurity concentration the p-type region 28 and less than or equal to 5E+17 [cm$^{-3}$].

Figure 14:
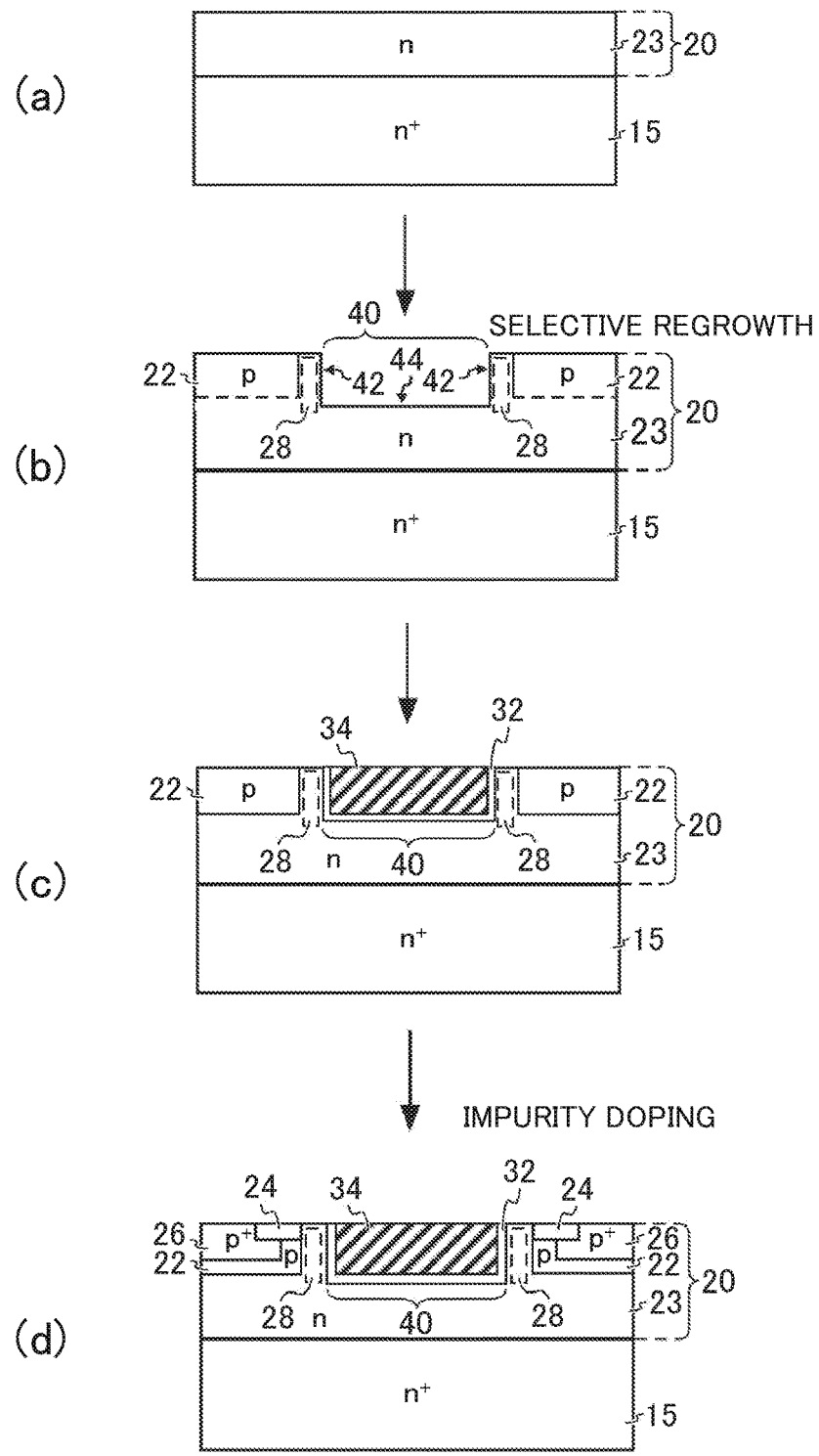
FIG. 14 shows a first manufacturing method for manufacturing the MOSFET 600.

FIG. 14 shows a first manufacturing method for manufacturing the MOSFET 600. In the first manufacturing method, the p-type region 22 and the p-type region 28 are formed using selective regrowth. Stage (a) in FIG. 14 shows a stage of epitaxially growing the n-type drift region 23 on top of the n$^+$-type substrate 15.

Stage (b) in FIG. 14 is the stage after stage (a) in FIG. 14. Stage (b) in FIG. 14 shows a stage of selectively regrowing the p-type region 22 and the p-type region 28. The p-type region 22 and the p-type region 28 are selectively regrown on top of the drift region 23 in a manner to sandwich the region where the trench portion 40 is formed. The drift region 23 may be selectively regrown such that the bottom portion of the p-type region 22 is farther upward than the bottom portion 44 of the trench portion 40. Furthermore, if the p-type region 22 and the p-type region 28 have the same p-type impurity concentration, the p-type region 22 and the p-type region 28 can be selectively regrown together. On the other hand, if the p-type region 22 has a higher p-type impurity concentration than the p-type region 28, the p-type region 22 and the p-type region 28 may be selectively regrown together and then the p-type region 22 may be additionally injected with p-type impurities.

Stage (c) in FIG. 14 is the stage after stage (b) in FIG. 14. Stage (c) in FIG. 14 shows a stage of forming the gate insulating film 32 and the gate electrode 34 in the trench portion 40. Stage (d) in FIG. 14 is the stage after stage (c) in FIG. 14. Stage (d) in FIG. 14 shows a stage of ion-injecting n-type and p-type impurities into the p-type region 22, and then applying thermal processing. In this way, the n$^+$-type source region 24 and the p$^-$-type contact region 26 are formed. After this, the source electrode 36 and the drain electrode 38 are formed to complete the MOSFET 600.

Figure 15:
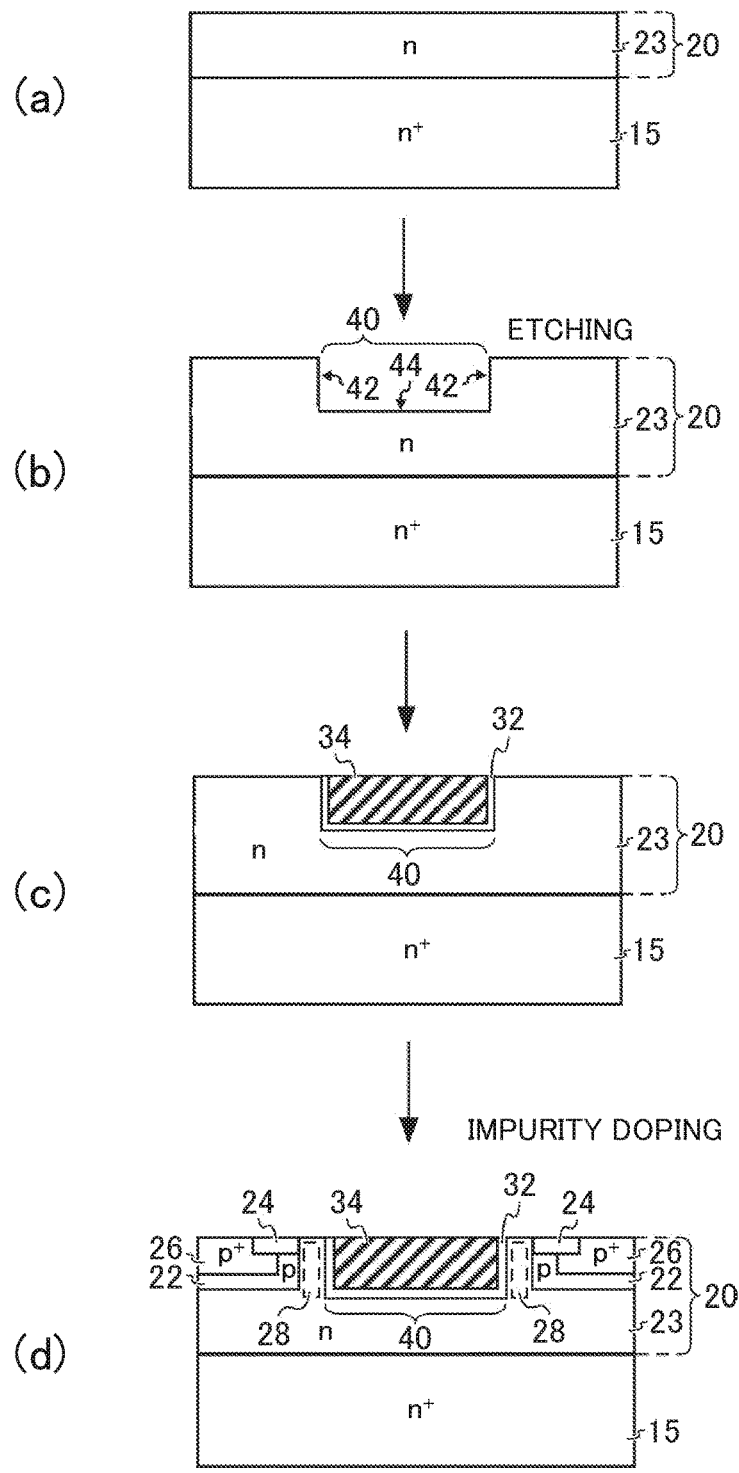
FIG. 15 shows a second manufacturing method for manufacturing the MOSFET 600.

FIG. 15 shows a second manufacturing method for manufacturing the MOSFET 600. In the second manufacturing method, the trench portion 40 is formed by etching. Furthermore, the p-type region 22 and the p-type region 28 are formed by ion-injecting p-type impurities into a portion of the n-type drift region 23. The second manufacturing method differs from the first manufacturing method with regard to these points.

Stage (a) in FIG. 15 shows a stage of epitaxially growing the n-type drift region 23 on top of the n$^+$-type substrate 15. Stage (b) in FIG. 15 is the stage after stage (a) in FIG. 15. Stage (b) in FIG. 15 shows a stage of removing the drift region 23 at a position where the trench portion 40 is formed. Stage (c) in FIG. 15 is the stage after stage (b) in FIG. 15. Stage (c) in FIG. 15 shows a stage of forming the gate insulating film 32 and the gate electrode 34 in the trench portion 40.

Stage (d) in FIG. 15 is the stage after stage (c) in FIG. 15. Stage (d) in FIG. 15 shows a stage of ion-injecting n-type and p-type impurities into a portion of the n-type drift region 23, and then applying thermal processing. In this way, the p-type region 22, the n$^+$-type source region 24, the p$^+$-type contact region 26, and the p-type region 28 are formed. After this, the source electrode 36 and the drain electrode 38 are formed to complete the MOSFET 600.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: substrate, 15: substrate, 20: epitaxial layer, 22: p-type region, 23: drift region, 24: source region, 25: drain region, 26: contact region, 28: p-type region, 32: gate insulating film, 34: gate electrode, 36: source electrode, 38: drain electrode, 40: trench portion, 42: side wall, 44: bottom portion, 100: MOSFET, 200: MOSFET, 300: MOSFET, 400: MOSFET, 500: MOSFET, 600: MOSFET

What is claimed is:
1. A MOSFET comprising:
a gallium nitride substrate;
a homoepitaxial layer made of gallium nitride formed homoepitaxially on top of the gallium nitride substrate;
a gate insulating film provided in direct contact with the homoepitaxial layer; and
a gate electrode provided in contact with the gate insulating film, wherein
the gallium nitride substrate has a dislocation density less than or equal to 1E+6 cm$^{-2}$,
the homoepitaxial layer has a region with a p-type impurity concentration less than or equal to 5E+17 cm$^{-3}$, and
a dislocation density of the homoepitaxially formed homoepitaxial layer is approximately equal to the dislocation density of the gallium nitride substrate.

2. The MOSFET according to claim 1, wherein
the region of the homoepitaxial layer has the p-type impurity concentration less than or equal to $5E+16$ $cm^{-3}$.
3. The MOSFET according to claim 1, wherein
the p-type impurities includes magnesium.
4. The MOSFET according to claim 1, wherein
the gate insulating film includes silicon dioxide, aluminum oxide, or a layered film having silicon dioxide and aluminum oxide.
5. The MOSFET according to claim 1, wherein
the region of the homoepitaxial layer is a well region.
6. The MOSFET according to claim 1, wherein
the MOSFET is a planar gate MOSFET in which the gate insulating film is provided on top of and in direct contact with the region of the homoepitaxial layer.
7. The MOSFET according to claim 1, wherein
the homoepitaxial layer includes a trench portion in which the gate insulating film and the gate electrode are provided, and
the MOSFET is a trench gate MOSFET in which the gate insulating film is provided in contact with side walls of the trench portion and in direct contact with the region of the homoepitaxial layer.

* * * * *